United States Patent
Kwok et al.

(10) Patent No.: US 11,121,290 B2
(45) Date of Patent: Sep. 14, 2021

(54) BARRIER FREE STABLE QUANTUM DOT FILM

(71) Applicant: Nano and Advanced Materials Institute Limited, Hong Kong (HK)

(72) Inventors: Chi Ho Kwok, Hong Kong (HK); Chi Hin Wong, Hong Kong (HK); Wing Yin Yung, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 484 days.

(21) Appl. No.: 16/307,137

(22) PCT Filed: Nov. 2, 2018

(86) PCT No.: PCT/CN2018/113821
§ 371 (c)(1),
(2) Date: Dec. 5, 2018

(87) PCT Pub. No.: WO2019/091346
PCT Pub. Date: May 16, 2019

(65) Prior Publication Data
US 2021/0234076 A1     Jul. 29, 2021

Related U.S. Application Data

(60) Provisional application No. 62/707,558, filed on Nov. 8, 2017.

(51) Int. Cl.
*C09K 11/02* (2006.01)
*C09K 11/88* (2006.01)
(Continued)

(52) U.S. Cl.
CPC .............. *H01L 33/507* (2013.01); *C09J 4/00* (2013.01); *C09J 5/00* (2013.01); *C09J 11/04* (2013.01);
(Continued)

(58) Field of Classification Search
CPC .......... B32B 27/38; B32B 27/08; C09J 11/04; C09K 11/02; G02F 1/1336
See application file for complete search history.

(56) References Cited

U.S. PATENT DOCUMENTS 6,992,317 B2   1/2006  Jain et al.
7,589,240 B2   9/2009  Emrick et al.
(Continued)

FOREIGN PATENT DOCUMENTS

CN   103151412 A   6/2013
CN   105637060 A   6/2016
(Continued)

OTHER PUBLICATIONS

International Search Report of PCT Patent Application No. PCT/CN2018/113821 dated Jan. 30, 2019.

*Primary Examiner* — Brian Turner (57) ABSTRACT

A barrier free quantum dot particles film includes a free standing layer comprising shielded quantum dot particles; wherein the shielded quantum dot particles are formed by shielding quantum dot particles by at least one shielding method; wherein the shielded quantum dot particles are characterized in resisting at least one condition selected from the group consisting of high temperature, high humidity and water; and wherein the shielded quantum dot particles are dispersed in an acrylate adhesive. A method of fabricating a barrier free quantum dot particles free standing
(Continued)

film is also disclosed. The method of fabrication of shielded quantum dot particles film on a light emitting diode (LED) lens is also disclosed.

9 Claims, 10 Drawing Sheets

(51) Int. Cl.

| | |
|---|---|
| C08K 3/30 | (2006.01) |
| C08G 77/392 | (2006.01) |
| C09K 11/70 | (2006.01) |
| H01L 33/50 | (2010.01) |
| C09J 4/00 | (2006.01) |
| C09J 5/00 | (2006.01) |
| C09J 11/04 | (2006.01) |
| C09J 133/12 | (2006.01) |
| B82Y 20/00 | (2011.01) |
| B82Y 40/00 | (2011.01) |

(52) U.S. Cl.
CPC ........... *C09J 133/12* (2013.01); *C09K 11/883* (2013.01); *H01L 33/504* (2013.01); *H01L 33/505* (2013.01); *B82Y 20/00* (2013.01); *B82Y 40/00* (2013.01); *C09J 2203/326* (2013.01); *C09J 2433/00* (2013.01); *C09J 2467/008* (2013.01); *H01L 2933/0041* (2013.01)

(56) References Cited

U.S. PATENT DOCUMENTS

| | | | |
|---|---|---|---|
| 8,766,315 | B2 | 7/2014 | Kang et al. |
| 8,859,442 | B2 | 10/2014 | Naasani et al. |
| 9,082,941 | B2 | 7/2015 | Naasani et al. |
| 9,701,897 | B2 | 7/2017 | Xu et al. |
| 2010/0237323 | A1* | 9/2010 | Akai ............... H01L 51/5012 257/13 |
| 2011/0045094 | A1 | 2/2011 | Han et al. |
| 2014/0027711 | A1 | 1/2014 | Breen et al. |
| 2014/0077132 | A1* | 3/2014 | Ijiro ............... C07F 1/12 252/301.36 |
| 2015/0047765 | A1 | 2/2015 | Vo et al. |
| 2015/0275078 | A1 | 10/2015 | Vo et al. |
| 2015/0368553 | A1 | 12/2015 | Nelson et al. |
| 2016/0230958 | A1* | 8/2016 | Pickard ............... F21V 7/04 |
| 2016/0268483 | A1 | 9/2016 | Theobald et al. |
| 2016/0289552 | A1 | 10/2016 | Werner et al. |
| 2016/0336490 | A1* | 11/2016 | Zhao ............... C09K 11/621 |
| 2016/0376498 | A1 | 12/2016 | Qiu |
| 2017/0225141 | A1 | 8/2017 | Schotten et al. |
| 2018/0291226 | A1* | 10/2018 | Chen ............... C08J 7/0423 |
| 2019/0345379 | A1* | 11/2019 | Budd ............... C08L 29/10 |

FOREIGN PATENT DOCUMENTS

| | | | |
|---|---|---|---|
| CN | 106103645 A | 11/2016 | |
| CN | 106795426 A | 5/2017 | |
| CN | 107708996 A | 2/2018 | |
| EP | 2214218 A2 | 8/2010 | |
| WO | WO-2016003986 A1 * | 1/2016 | ............... C09J 7/35 |

* cited by examiner

BARRIER FREE STABLE QUANTUM DOT FILM

CROSS-REFERENCE TO RELATED APPLICATIONS AND PRIORITY

The present application claims priority from U.S. Provisional Application No. 62/707,558 filed on Nov. 8, 2017, the entirety of which is incorporated herein by reference.

TECHNICAL FIELD

The present application relates to a barrier free stable quantum dot film which is resistant to harsh environmental conditions. More particularly, the present application relates to a barrier free stable quantum dot film which is resistant to the external conditions such as moisture, temperature, water and the like.

BACKGROUND

An advancement in nanotechnology has emerged the field of quantum dots in various sectors. Emissive quantum dot particles (QD) have various applications in multiple domains due to small size (micro-, nano-) of the quantum dot particles, as their optical and electronic properties differ from the larger particles. It has been known in the existing art that photo emissive quantum dot particles are used in QD layer converting the backlight to emit pure basic colours. The modification in QD enhances color gamut of display and electroluminescence of LCD chips.

One such application of QD film is LCD display. In a typical LCD display, white light is received from the LED which is diffused by the light guide plate back panel and directed to the polarizer. A liquid crystal display (LCD) is used to control the light passing through the color filters, polarizing film and then generating the color by pixel. The success of integrating QD technology into display technology is attributed to the key components called QD films, focusing on photoluminescence technique.

The approaches known in the existing art discloses QD films consisting of three major components including a QD emissive layer sandwiched between two transparent films, a barrier layer which is made of repeated deposition of metal oxides and organic components by vacuum disposition and sputtering technology, and the brightness enhancement films with specific micro-/nano-structures as the outermost layers.

Generally, quantum dot films are beneficial, however, these are sensitive to the high humidity and temperature. In order to protect QDs from these environmental impacts, barrier films have always been employed in existing technologies. However, production of barrier film includes a huge investment of coating machine in order to obtain extremely high coating accuracy of ±2-5 um. Therefore, the bill of material (BOM) cost of QDs film is mainly attributed to the higher cost of the barrier film.

Therefore, there is a long felt need of fabrication of economically significant and environmentally stable barrier layer free, free standing quantum dot film. In view of these issues, the disclosed application describes a development of barrier free quantum dot (QD) materials with intrinsic thermally stable and water-resistant properties.

SUMMARY

Before the present processes, methods and products are described, it is to be understood that this disclosure is not limited to the particular processes, methods and products as described, as there can be multiple possible embodiments which are not expressly illustrated in the present disclosure but may still be practicable within the scope of the application. It is also to be understood that the terminology used in the description is for the purpose of describing the particular versions or embodiments only and is not intended to limit the scope of the present application. This summary is not intended to identify essential features of the subject matter nor is it intended for use in detecting or limiting the scope of the subject matter.

In one embodiment, a barrier free quantum dot particles film is described. The film may include a free-standing layer of quantum dot particles. In one aspect, the quantum dot particles may be shielded by a shielding method. In one embodiment, the shielding method may include at least one of a house shielding method, a ligand shielding method and a jacket shielding method and a combination thereof. The shielded quantum dot particles are characterized in resisting at least one of high temperature, high humidity and water. Further, the shielded quantum dot particles are dispersed in one of an acrylate adhesive, a silicone adhesive, a thermoplastic adhesive, and an UV cured adhesive.

In one embodiment, the barrier free quantum dot particles film may optionally comprise at least two outer layers, wherein each of the at least two outer layers may be a film selected from the group consisting of polyethylene terephthalate (PET) film, a polyethylene naphthalate (PEN) film and a polyacrylonitrile (PAN) film. The free-standing layer of quantum dot particles layer may optionally be sandwiched between at least two outer layers.

In another embodiment, a method of fabrication of free standing a barrier free quantum dot particles film is described. The method may include shielding the quantum dot particles by a shielding method. In one embodiment, the shielding method may include at least one of a house shielding method, a ligand shielding method and a jacket shielding method and combination thereof. The method may further include dispersing a layer of the shielded quantum dot particles in of an acrylate adhesive, a silicone adhesive, a thermoplastic adhesive, and an UV cured adhesive. The method is characterized in resisting the shielded quantum dot particles, dispersed in one of the acrylate adhesive, a silicone adhesive, a thermoplastic adhesive, and an UV cured adhesive, to high temperature, high humidity and water.

BRIEF DESCRIPTION OF DRAWINGS

The detailed description is described with reference to the accompanying Figures. In the Figures, the left-most digit(s) of a reference number identifies the Figure in which the reference number first appears. The same numbers are used throughout the drawings to refer like features and components.

DETAILED DESCRIPTION

Reference throughout the specification to "various embodiments," "some embodiments," "one embodiment," or "an embodiment" means that a particular feature, structure, or characteristic described in connection with the embodiment is included in at least one embodiment. Thus, appearances of the phrases "in various embodiments," "in some embodiments," "in one embodiment," or "in an embodiment" in places throughout the specification are not necessarily all referring to the same embodiment. Furthermore, the particular features, structures or characteristics may be combined in any suitable manner in one or more embodiments.

The application relates to a barrier free stable quantum dot film resistant to harsh environmental conditions. The present application proposes shielding of the quantum dot particles (also referred hereinafter as quantum dot particles interchangeably) by an extra shielding layer. The shielding of the quantum dot particles remains stable in high humidity and high temperature environment. Therefore, the present application increases the thermal stability and water-resistance capacity of the quantum dot particles (QD) without altering the basic structure of quantum dot particles by following shielding method approaches including house shielding method, ligand shielding method and jacket shielding method.

Some embodiments of this disclosure, illustrating all its features, may now be discussed in detail. The words "comprising", "having" "containing" and "including" and other forms thereof, are intended to be equivalent in meaning and be open ended in that an item or items following any one of these words is not meant to be an exhaustive listing of such item or items or meant to be limited to only the listed item or items. It must also be noted that, the singular forms "a" "an" and "the" include plural references unless the context clearly dictates otherwise.

It may be understood by all readers of this written description that the example embodiments described herein and claimed hereafter may be suitably practiced in the absence of any recited feature, element or step that is, or is not, specifically disclosed herein. For instance, references in this written description to "one embodiment," "an embodiment," "an exemplary embodiment," and the like, indicate that the embodiment described can include a particular feature, structure, or characteristic, but every embodiment may not necessarily include the particular feature, structure, or characteristic. The disclosed embodiments are merely exemplary of various forms or combinations. Moreover, such phrases are not necessarily referring to the same embodiment. Further, when a particular feature, structure, or characteristic is described in connection with an embodiment, it is submitted that it is within the knowledge of one of ordinary skill in the art to adopt such feature, structure, or characteristic in connection with other embodiments whether or not explicitly described.

The electroluminescent and photoluminescent quantum dots (alternatively referred to as "quantum dot particles" or QDs) have various lighting and display applications. Therefore, a barrier free and thermal and water-resistant shielded quantum dots film, and method of fabrication of film, are described in this disclosure. In one embodiment, the disclosed quantum dot particles are in the nanometre range.

Figure 1:
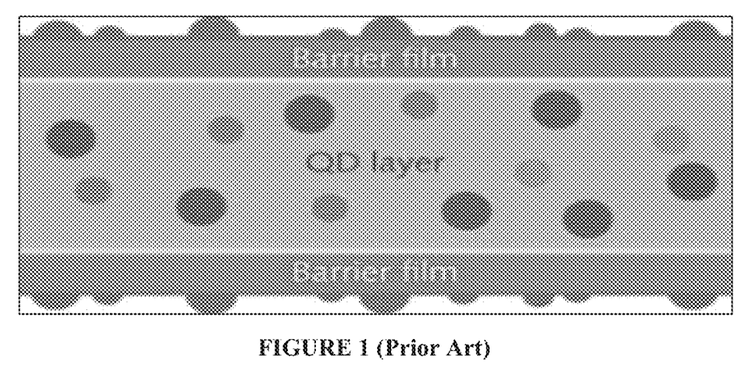
FIG. 1 illustrates a typical structure of QDs film with barrier films conventionally available in the prior art.

FIG. 1 illustrates the existing barrier films available in the prior art. As depicted in FIG. 1, it can be observed that to provide extra stability to the quantum dot material, the barrier films are introduced. Such barrier films protect QDs from high environmental impacts. However, production of barrier film requires high cost coating machines therefore increasing the total cost of quantum dot films.

Figure 2:
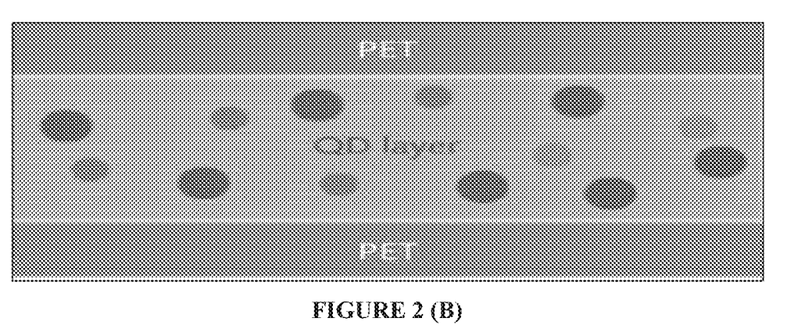
FIG. 2(A) illustrates a barrier free quantum dot particles free standing layer film with QD emissive layer, in accordance with an embodiment of the present application.
FIG. 2(B) illustrates a barrier free quantum dot particles film with QD emissive layer, optionally sandwiched between at least two outer layer films, in accordance with an embodiment of the present application.
Figure 2A:
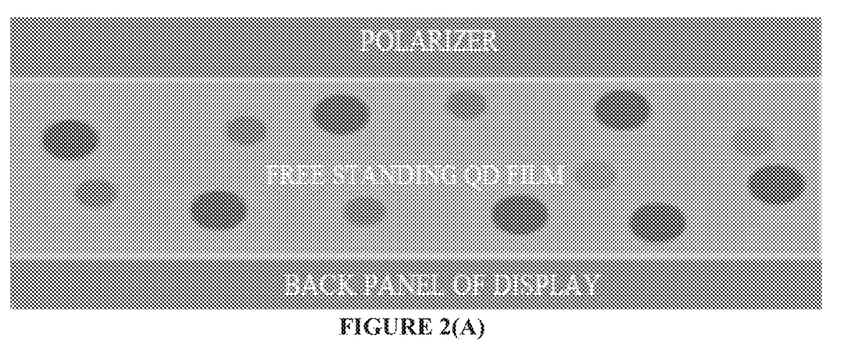

Referring to FIG. 2(A), the disclosure of the present application describes a barrier free quantum dot particles film, wherein the film may include a free-standing layer of quantum dot particles dispersion. In other words, the Quantum dot particles film may be a free-standing dispersion of shielded quantum dots without any protective film layer. The free-standing layer of shielded quantum dot particles is further coated or inserted in the form of film between the back pane and the polarizer of the display device or an emissive device.

Referring to FIG. 2(B), the disclosure of the present application describes a barrier free quantum dot particles film, wherein the film may optionally include at least two outer layers. Each outer layer is selected from one of a polyethylene terephthalate (PET), polyethylene naphthalate (PEN) and polyacrylonitrile (PAN) film In one embodiment, each outer layer of the barrier film may have a water vapor transmission rate (WVTR) within a range of 1-10 $g/m^2d$ and an oxygen transmission rate (OTR) within the range of 50-200 $cm^3/m^2d$.

Further, the film may include an inner layer of quantum dot particles optionally sandwiched between the at least two outer layers (FIG. 2(B)) or a free-standing quantum dot particles layer without any protective layer (FIG. 2(A)). In one embodiment, the quantum dot particles may be selected from CdSe, ZnS, CdZnS, MAPbX$_3$ (MA=methylammonium; X=Cl, Br, I); and combinations thereof. In an embodiment, the size of the quantum dot particles may be within a range of 4 nm to 8 nm. The quantum dot particles may be initially hydrophobized with hydrophobic ligands. The hydrophobic ligands introducing the hydrophobicity to the quantum dot particles may be selected from C3-C21 aliphatic, branched, cyclic and aromatic thiol.

The quantum dot particles may be shielded by a shielding method. In one embodiment, the shielding method may be at least one of a house shielding method, a ligand shielding method and a jacket shielding method. In one aspect, the shielded quantum dot particles are characterized in resisting at least one of high temperature, high humidity and water moisture. Further, the shielded quantum dot particles are dispersed in acrylate adhesive. It must be noted herein that the quantum dot particles dispersed in the acrylate type adhesive produces a free-standing film and can be incorporated over a LED without any protective layer.

Figure 3:
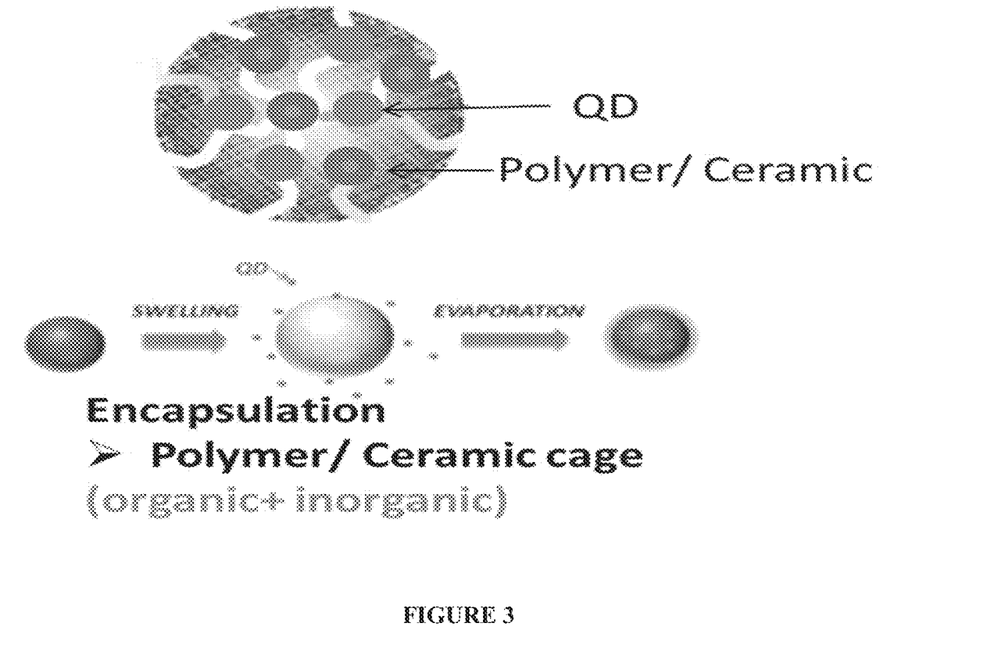
FIG. 3 illustrates a house shielding method of quantum dot particles encapsulated and dispersed in adhesive cage of acrylate adhesive, in accordance with an embodiment of the present application.

Referring to FIG. 3, a barrier free quantum dot film produced via a house shielding method is illustrated. The house shielding method may include encapsulating of the quantum dot in crosslinked polymeric beads material and further dispersing the quantum dot particles in the acrylate adhesive type cage as shown in FIG. 4.

Figure 4:
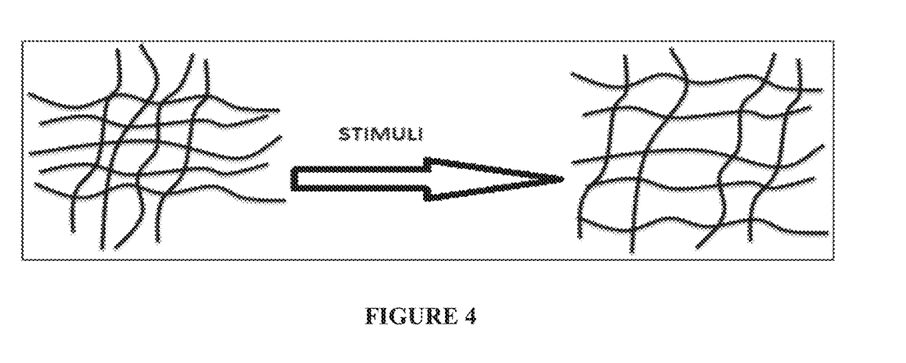
FIG. 4 illustrates simulation of the swelling of crosslinked polymer beads by sonication process, in accordance with an embodiment of the present application.

Referring to FIG. 4, the crosslinked polymer materials may be subjected to a swelling process by influential external heating stimuli. As the volume of the polymer increases, based on the idea of concentration different, quantum dot particles may be drawn into the particles of the crosslinked polymers. The mixture is then washed with a solvent with lower solubility in order to contract the polymer and therefore, quantum dot particles will be trapped inside the polymer beads.

Figure 5:
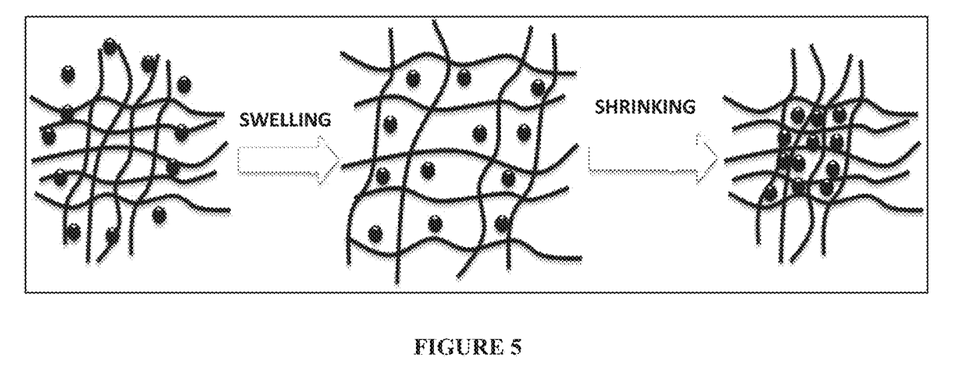
FIG. 5 illustrates the swelling and shrinking of the cross-linked polymer beads and encapsulation of the quantum dot particles in the crosslinked polymer beads, in accordance with an embodiment of the present application.

Referring to FIG. 5, during swelling process, a large amount of quantum dot particles may be embedded in the spheres of the crosslinked polymer beads. Because of the effect of the polymer network, the embedded quantum dot particles may be spatially separated, further forbidding the energy transfer between quantum dot particles. Therefore, any kind of reduction of fluorescence properties is not observed after encapsulation. Furthermore, only quantum dot particles within certain size range may be incorporated into the polymer and thus showing the full width half maximum (FWHM) narrow emission spectra, which may be further narrowed as the swelling process excludes the QDs that are out of the size range.

The house shielding method for shielding the quantum dot particles may utilize crosslinked polymer beads enabled as quantum dot carriers. The quantum dot carrier polymer beads may be selected from at least one of polystyrene and polymethyl methacrylate. The quantum dot carrier polymer beads crosslinking process may be carried out by crosslinkers selected from divinylbenzene, N,N'-Methylene-bis-acrylamide, ethylene glycol di-methacrylate, Poly(ethylene glycol)-block-poly(propylene glycol)-block-poly(ethylene glycol), Poly(methyl methacrylate-co-methacrylic acid), poly(1-(3-aminopropyl)pyrrole) and poly(para-methyl triphenylamine-b-cysteamine acrylamide) crosslinker. The size of crosslinkers may be within a range of 100 nm to 5 μm. The amount of crosslinkers in the dispersion may be within a range of 1 to 5% wt of the dispersion.

Figure 6:
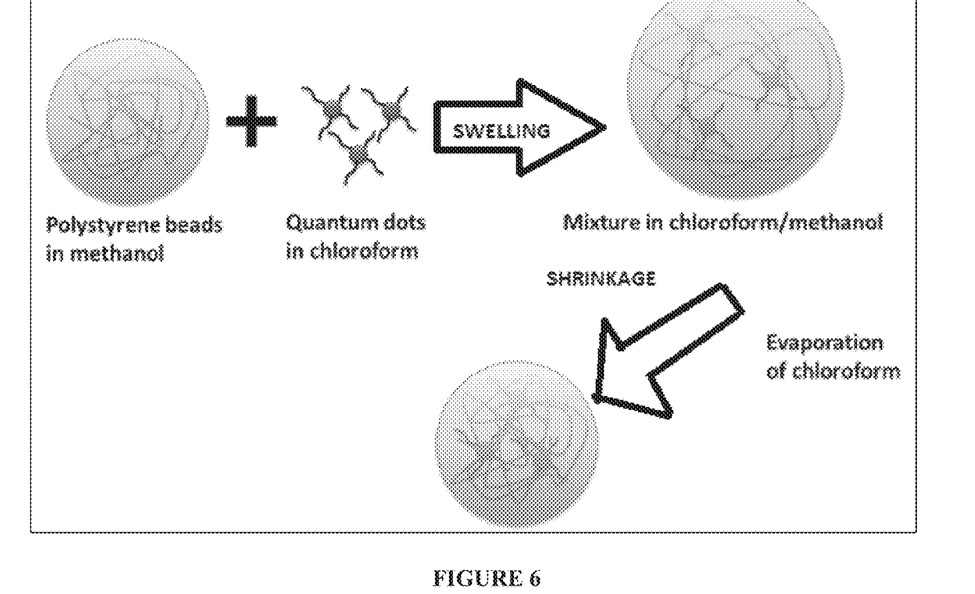
FIG. 6 illustrates evaporation of solvent from the swelling and shrinking process in order to obtain free standing film of encapsulated polymers by jacket shielding method, in accordance with an embodiment of the present application.

Referring to FIG. 6, cross-linked polystyrene beads may be referred a good candidate for achieving the purpose of encapsulating of the quantum dot particles in polymer beads. The quantum dot particles may be embedded in the polystyrene through hydrophobic interactions between the cross-linked polymer beads and quantum dot particles. The extent of swelling may be controlled by using different portion of chloroform in which to maximize the encapsulation of QDs. The polymers beads encapsulating the quantum dot particles may shrink by adding non-solvent such as alcohol or acetone. The encapsulation of quantum dot particles into polymer beads may reduce the drop of fluorescence properties in the case of emulsion polymerization, reduce the extent of aggregation between quantum dot particles and further promote the colloidal stability of quantum dot particles. The solvents used may be selected from one of a methanol and chloroform or other polar solvents.

In one embodiment, the encapsulating of the quantum dot particles may be controlled by sonicating and further evaporating excess solvent from the carrier crosslinked polymer. The encapsulation efficiency of carrier polymers may be achieved within a range of 5 to 20%. The size of house shielding encapsulation of quantum dot particles may be within a range of 0.5 μm-50 μm, and more preferably within a range of 5-10 μm. The house shielding method enables the moisture resistance of the quantum dot particles.

Figure 7:
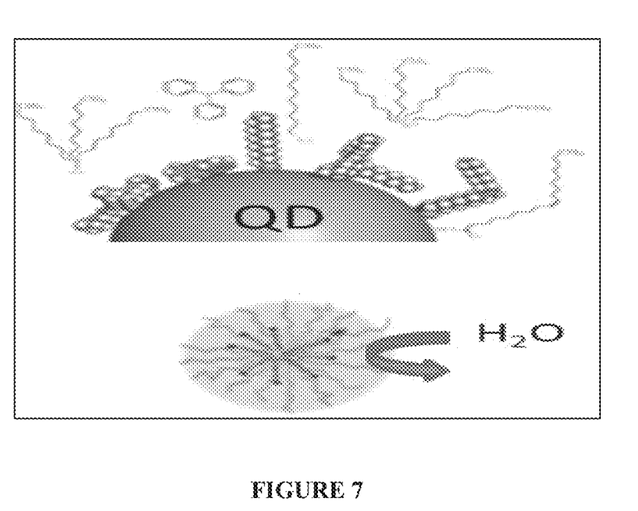
FIG. 7 illustrates a ligand shielding method of quantum dot particles and shielding of quantum dot particles by a surfactant-ligand co-system and enabling stability and rigidity to the quantum dot particles, in accordance with an embodiment of the present application.

In one embodiment, referring to FIG. 7, a barrier free quantum dot film produced via a ligand shielding method is illustrated. The ligand shielding method may include encapsulation of the quantum dot particles in surfactant ligand co-system in the form of liquid, grease or paste. It must be noted herein that the ligand shielding method may enable properties such as surface rigidity and extra stability along with water resistance to the quantum dot particles. In one embodiment, the surfactants may include, but not limited to, block-co-polymers and non-ionic surfactant with good hydrophilic-lipophilic balance, and the like. In one embodiment, the ligands may include long chain alkyl and aromatic thiol groups. In one exemplary embodiment, HO(CH$_2$CH$_2$O)$_{20}$(CH$_2$CH(CH$_3$)O)$_{70}$(CH$_2$CH$_2$O)$_{20}$H (Pluronic P123) and octanethiol may be used as co-system for quantum dot particles encapsulation.

In one embodiment, the surfactant for the ligand shielding method may be selected from, and is not limited to, a block copolymers such as poly(ethylene glycol)-block-poly(propylene glycol)-block-poly(ethylene glycol), poly(propylene glycol)-block-poly(ethylene glycol)-block-poly(propylene glycol), polystyrene-block-poly(acrylic acid), a copolymer such as poly(methyl methacrylate-co-methacrylic acid), poly(styrene)-co-methacrylic acid; a non-ionic surfactant such as polyethylene glycol oleyl ether, polyoxyethylene (5) nonylphenylether, and polyethylene-block-poly(ethylene glycol). In one embodiment, the amount of surfactant in the system may be within a range from 1-10% wt.

In one embodiment ligand co-system of ligand shielding method is selected from Pluronic P123, octanethiol, C3-C21 aliphatic thiols, branched thiols, cyclic thiols, aromatic thiol, C3-C21 aliphatic amines, branched amines, cyclic amines and aromatic amines, wherein the amount of ligand is within the range of 1-10% wt. dispersion.

In one embodiment, hydrophilic-lipophilic balance is a scale to determine the hydrophilicity/lipophilicity of the surfactant. A good hydrophilic-lipophilic balanced surfactant may work as a good emulsifying agent where a micelle can be formed in water/oil mixture. In such situation, quantum dot particles may be encapsulated in the micelle and the periphery is hydrophilic which provides an extra pathway for moisture to pass through. Therefore, the moisture passes through the film apart from the quantum dot particles (QDs). Further, the long chain alkyl/aromatic thiol may work as a surface ligand for ligand exchange of QDs. The ligands may be covalently boned on the surface of the QDs which provides a more rigid surface and also increase the inter-particles distance preventing inter-particles interaction. This approach highly promotes the thermal stability of the quantum dot particles against the environmental change.

In one embodiment, the ligands may be assembled on the surface of the quantum dot particles in such a way that the hydrophobic part of the surfactant may surround the quantum dot particles and the hydrophilic parts may be pointing outward further providing a path for water to pass through the film instead of destructing the quantum dot particles, and thereby introducing water resistivity and film stability to the barrier free quantum dot particles film.

Figure 8:
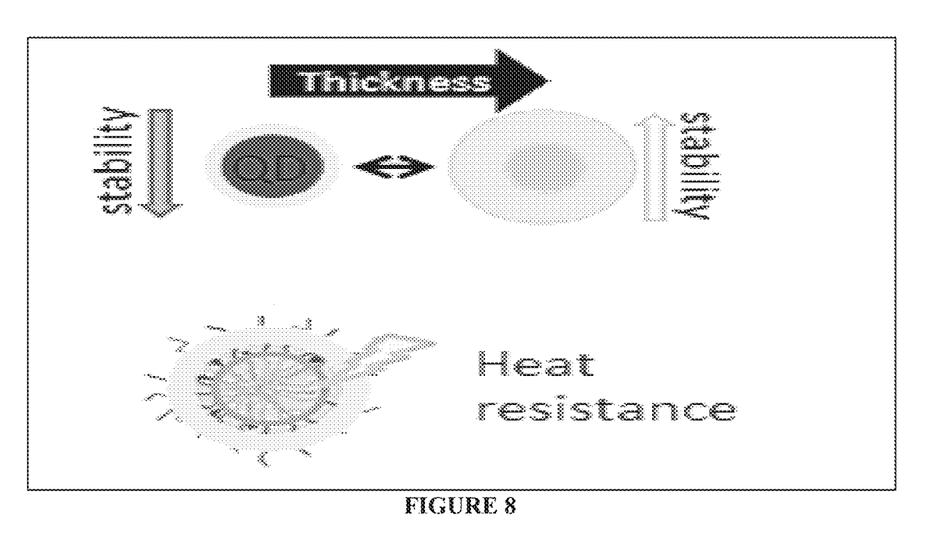
FIG. 8 illustrates a jacket shielding method of quantum dot particles and shielding of quantum dot particles by core-shell and multi-shell coating and enabling the quantum dot particles to have heat resistant properties, in accordance with an embodiment of the present application.

Referring to FIG. 8, the barrier free quantum dot film may include shielded quantum dot particles, protected by a jacket shielding method, in accordance with an embodiment of the present application. The stability of the quantum dot particles may be enhanced through structural engineering. The quantum dot particles with core/shell structures are observed to be more stable as compared to the other quantum dot particles. Therefore, the photoluminescence core of quantum dot particles may be shielded by the shell, and the core may be much stable towards environmental change. Therefore, a structural design of quantum dot particles to tune the thickness of the shell on quantum dot may be introduced in the jacket shielding method.

Figure 9:
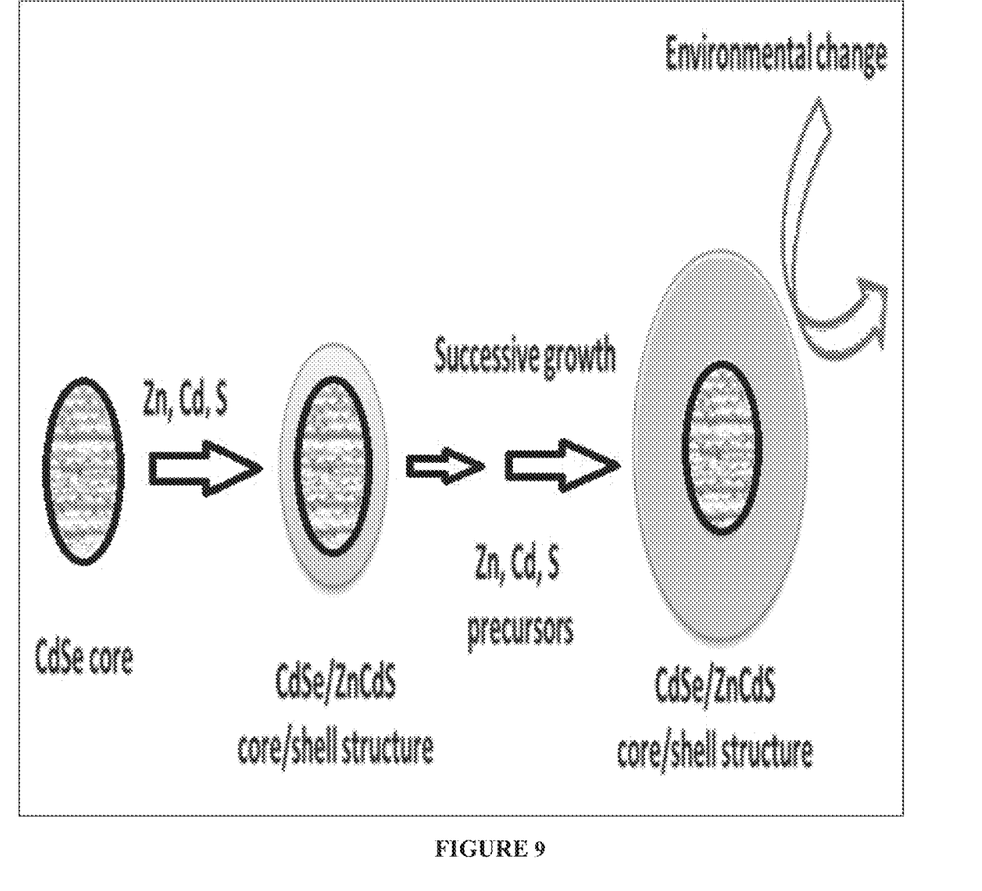
FIG. 9 illustrates shielding of quantum dot core particles by multi-shell successive coating of shell materials, in accordance with an embodiment of the present application.

Referring to FIG. 9, shielding of the quantum dot particles by the jacket shielding method is illustrated, in accordance with an embodiment of the present application. The jacket shielding method may include constructing a thick shell on the surface of quantum dot particles in order to protect quantum dot particles from moisture, oxygen, chemicals and thermal change. In one embodiment, multi-shell coating may also be incorporated to the core of quantum dot particles. The coated quantum dot particles (~12 nm) may be larger than uncoated quantum dot particles (~8 nm) which provide extra stability to the quantum dot particles.

The jacket shielding method may include core/shell shielding of the quantum dot particles with multi-shell coating on a metal-alloyed core of quantum dot particles. The multi-shell coating may include coating layer of 1-5 shells. The total size of the core/shell jacket shielding may be within a range of 8 nm to 20 nm. The size of the core quantum dot particle may be within a range 4 nm to 8 nm and the size of thickness of shell coating may be within a range 2 nm to 6 nm. The jacket shielding method may enable the quantum dot particles to have thermal resistant properties.

In one embodiment, the metal alloyed core-shell may include the core made of at least one of CdSe, ZnSe, CdZnSeS, and CdTe, MAPbX3 (MA=methylammonium; X=Cl, Br, I). In one embodiment, the shell coating may be made of at least one of ZnS and CdZnS metal alloys. In one embodiment, core-shell QDs may be fabricated as CdSe// ZnS, CdSeZnS@ZnS, CdSe@CdS, CdSeS@ZnS, CdSe@CdS@ZnS, CdSe@CdZnS@ZnS etc.

Referring to FIG. 9, in one exemplary embodiment, in the jacket shielding method used for preparing the barrier free quantum dot film, CdSe may be chosen as the core and shell may be grown with ZnCdS which has the modest lattice mismatch between core and shell. The shell thickness may be varied via a one-pot successive growth method. Zn, Cd and S precursors may be added successively during reaction to construct a thick shell. The quantum dot particles prepared through this approach provide good stability towards environmental change. In short, the shell thickness may be tuned through a one-pot synthesis which promotes the stability of quantum dot particles.

In one embodiment, a method of fabricating a barrier free quantum dot particles film is described. The method may include formation of a free-standing quantum dot particles layer. The method may further include shielding the free quantum dot particles by at least one of a shielding method and dispersing the shielded quantum dot particles in an acrylate adhesive in order to obtain a free-standing film. The method is characterized in achieving the properties such as resistance to high temperature, high humidity and water moisture.

In one embodiment, the method may optionally include formation of free-standing shielded quantum dot particles layer as an inner layer. The method may optionally include further sandwiching an inner layer of the shielded quantum dot particles, dispersed between the at least two outer layer, wherein each outer layer is selected from one of a polyethylene terephthalate (PET), polyethylene naphthalate (PEN) and Polyacrylonitrile (PAN) film coating. The method may include shielding the quantum dot particles by at least one of a shielding method and dispersing the shielded quantum dot particles in an acrylate adhesive in order to obtain a free-standing film layer. The method is characterized in achieving the properties such as resistance to high temperature, high humidity and water moisture.

In one embodiment, coating of a free standing layer of the quantum dot dispersed in adhesive on the back panel of display and between polarizer and back panel of display is enabled through roll to roll coating followed by molding and curing to obtain free standing film. The adhesive acrylate film may further be UV/heat cured in order to get extra stability to the rigidity of film.

In one embodiment, the method of fabrication of the barrier free quantum dot particles film may include shielding of the quantum dot particles by the shielding method which is at least one of a house shielding method, a ligand shielding method and a jacket shielding method. It may be understood that depending on the application of the quantum dot film, both thermal and moisture stable barrier free quantum dot film (BFQDF) may be fabricated by combination of house and jacket shield or only ligand shielding with co-surfactant system. Generally, in order to achieve highest stability, two or more method shielding method may be employed for the desired application. The barrier free quantum dot film (BFQDF) may be applied in QD-LED display, by applying QD on chips which may further increase the market value in display and lighting technology, and also, by integrating QD into printing technology and electroluminescence devices may also be developed for different applications.

EXPERIMENTAL EXAMPLES AND OBSERVATIONS

Example 1

Figure 10:
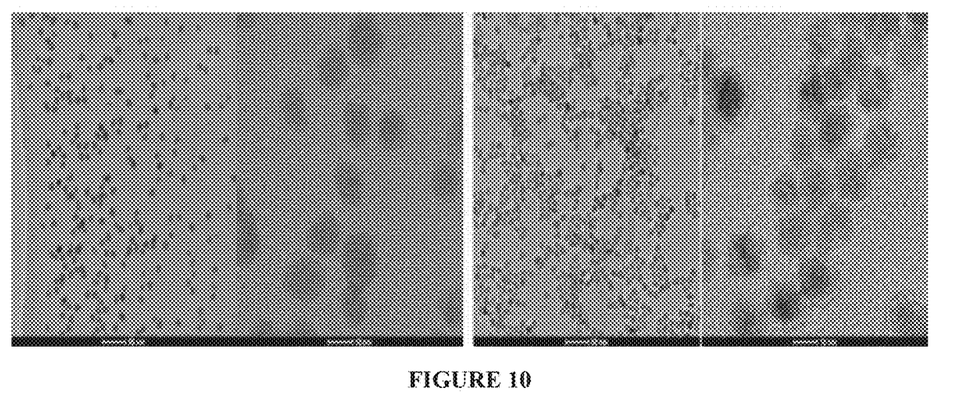
FIG. 10 and FIG. 11 illustrate TEM images of encapsulated quantum dot particles, in accordance with an embodiment of the present application.

In order to promote the reliability of quantum dot particles, multi-shell coating was employed. The TEM images as illustrated in FIG. 10 correspond to the multi-shell coated quantum dot particles. The coated quantum dot particles (~12 nm) were larger than uncoated quantum dot particles (~8 nm) providing extra stability to the quantum dot particles.

Example 2

Figure 11:
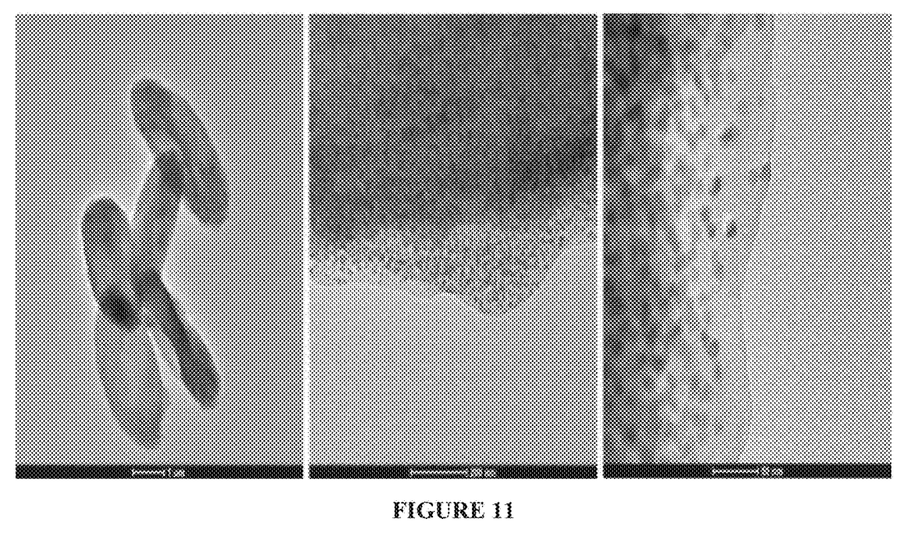

Referring to FIG. 11, the quantum dot particles were also encapsulated in polymer beads for stability enhancement, using a house shielding approach. The TEM image as illustrated in FIG. 11 shows the encapsulated quantum dot particles where the quantum dot particles were embedded in a poly-methyl methacrylate (PMMA) polymer beads. The polymer coating may hinder the quantum dot particles from oxygen and water providing extra protection towards the quantum dot particles.

Example 3

The shielded quantum dot particles were used for fabrication of quantum dot films. The ligand shielding approach was also employed for stability enhancement of barrier free quantum dot film. The quantum dot adhesive was prepared by mixing UV-curable adhesive, quantum dot particles and additives. The adhesive was then fabricated between two layers of PET films. The films were then put into two ovens (85° C. and 65° C. & 95% RH) for aging test and compared to other commercial product. The drop of quantum yield of the films may be a consideration of stability. Here, % RH refers to percent relative humidity and QY refers to quantum yield.

TABLE 1

| BFQDF | 0 h | 240 h | 410 h | 580 h | 1000 h |
|---|---|---|---|---|---|
| 65° C. 95% RH (QY) | 76.7% | 70.2% | 70.8% | 68.9% | 70.4% |
| 85° C. (QY) | 74.2% | 70.2% | 66% | 64.8% | 63.6% |

TABLE 2

| | 0 h | 170 h | 450 h | 1000 h |
|---|---|---|---|---|
| Brand 1 | | | | |
| 65° C. 95% RH (QY) | 76.2% | 71.7% | 63.3% | 53.4% |
| 85° C. (QY) | 79.2% | 63.1% | 61.5% | 57.5% |
| Brand 2 | | | | |
| 65° C. 95% RH (QY) | 79.1% | 77.9% | 69.1% | 63.6% |
| 85° C. (QY) | 80.2% | 62.2% | 55.9% | 53.1% |

Figure 12:
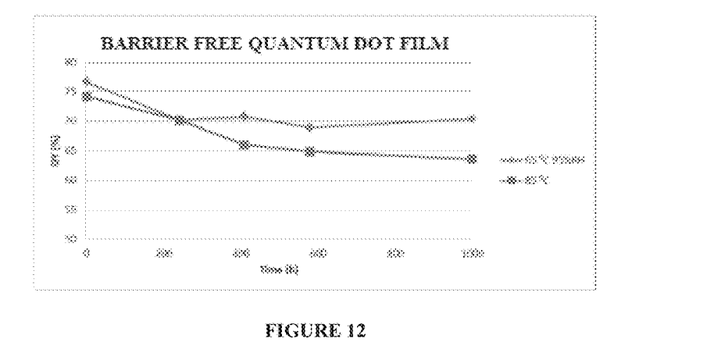
FIG. 12-17 illustrates a comparative analysis of barrier free quantum dot particles film with QD emissive layer vis-à-vis different conventional films available in the art.
Figure 13:
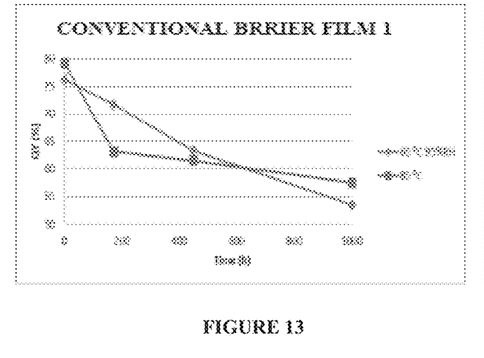
Figure 14:
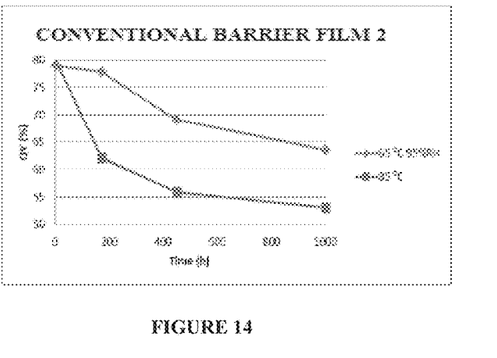

Referring to Tables 1-3 and FIGS. 12-14, it was observed that the barrier free quantum dot film (BFQDF) showed the best stability in both 85° C. and 65° C. & 95% RH tests. It was further observed that there was only a slight drop of QY after 1000 h testing ($\Delta 85$: 10.6% and $\Delta 6595$: 6.3%). In contrast, the existing commercial films showed poor stability after 1000 h testing. In the case of conventional barrier film 1, the drops of QY were both larger than 20% ($\Delta 85$: 21.7% and $\Delta 6595$: 22.8%). Furthermore, in the case of conventional barrier film 2, the drops of QY were around 20% ($\Delta 85$: 26.9% and $\Delta 6595$: 15.5%). The drop of QY affected the performance of film for light conversion and therefore, the performance of display was also affected.

Example 4

Figure 15:
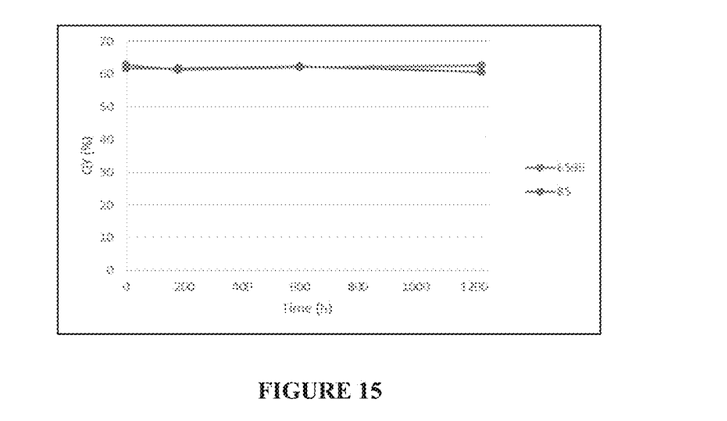

The barrier free quantum dot film (BFQDF) fabricated quantum dot particles were shielded by the jacket shielding method. The film prepared with jacket shielding method included green QDs CdSeZnS@ZnS (5 shell monolayers of ZnS) and red QDs CdSe@CdZnS (8 shell monolayers of CdZnS). Both QDs were mixed with UV adhesive and laminated with two layers of PET with WVTR 5 g/m2/day. These films were tested under 65° C. 95% RH and 85° C., and the results of the test are as those depicted in Table 3 and in reference with FIG. 15.

TABLE 3

| RA Test | QY at 0 h (%) | QY at 180 h (%) | QY at 600 h (%) | QY at 1225 h (%) |
|---|---|---|---|---|
| 65° C. 95% RH | 61.7 | 62.4 | 60.2 | 62.4 |
| 85° C. | 64.9 | 64.1 | 62.4 | 62.3 |

Example 5

Figure 16:
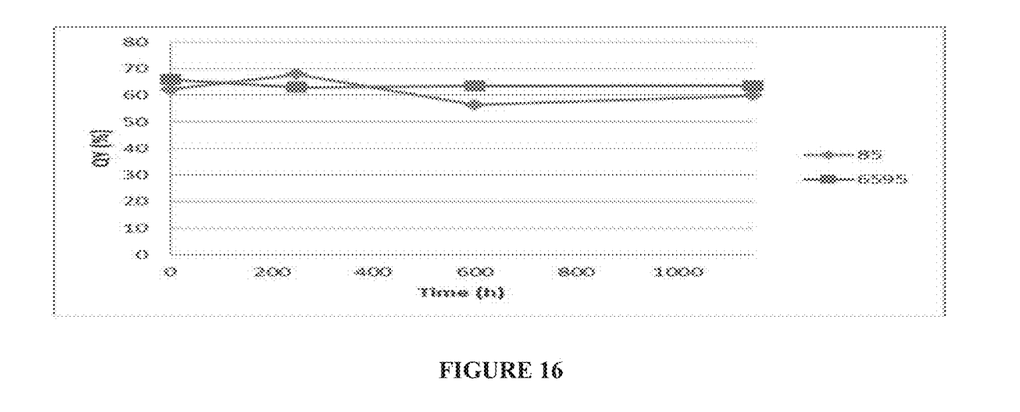

The barrier free quantum dot film (BFQDF) fabricated quantum dot particles were further shielded by a house shielding method. The BFQDF fabricated quantum dot particles prepared by the house shielding method included green QDs CdSeZnS and red QDs CdSe@CdZnS (3 monolayers of CdZnS). Both QDs were encapsulated in oxidized polyethylene (PE) microparticles, further mixed with UV acrylate adhesive and laminated with two layers of PET with WVTR 5 g/m2/day. These films were tested under 65° C. 95% RH and 85° C., and the results of this test are depicted in Table 4 and in reference with FIG. 16.

TABLE 4

| RA test | QY at 0 h (%) | QY at 250 h (%) | QY at 600 h (%) | QY at 1150 h (%) |
|---|---|---|---|---|
| 65° C. 95% RH | 65.8 | 62.9 | 56.2 | 63.5 |
| 85° C. | 63.4 | 67.8 | 63.4 | 59.7 |

Example 6

Figure 17:
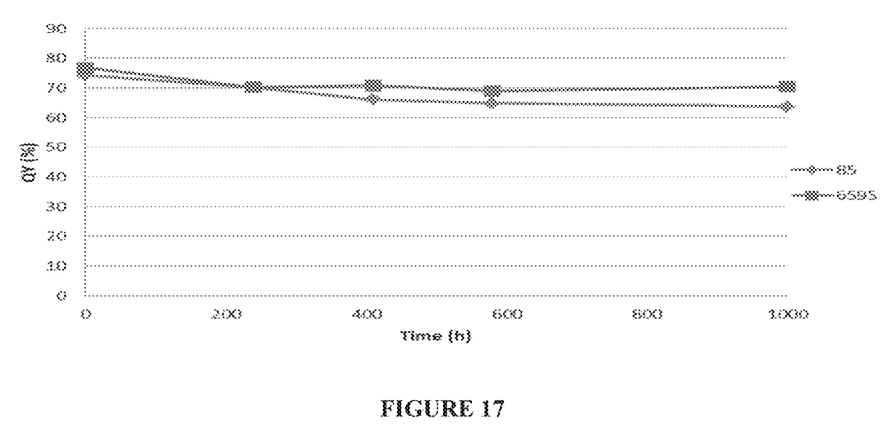

The barrier free quantum dot film (BFQDF) fabricated quantum dot particles were further shielded by a ligand shielding method. The film fabricated with chemical modification by the ligand shielding method included green QDs CdSeZnS and red QDs CdSeS@ZnS (3 shell monolayers of ZnS). QDs, non-ionic surfactant and thiol ligand were mixed with UV/heat cured acrylate adhesive and laminated with two layers of PET with WVTR 5 g/m2/day. These films were tested under 65° C. 95% RH and 85° C., and the results of the test are depicted in Table 5 and in reference with FIG. 17.

TABLE 5

| RA test | QY at 0 h (%) | QY at 240 h (%) | QY at 410 h (%) | QY at 580 h (%) | QY at 1000 h (%) |
|---|---|---|---|---|---|
| 65° C. 95% RH | 76.7 | 70.2 | 70.8 | 68.9 | 70.4 |
| 85° C. | 74.2 | 70.2 | 66.0 | 64.8 | 63.6 |

Example 7

Figure 18:
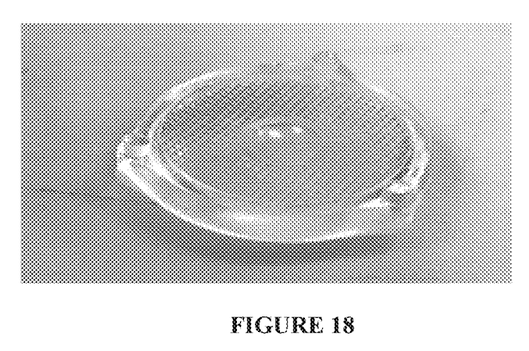
FIG. 18 illustrates an LED lens with shielded quantum dot particles, in accordance with an embodiment of the present application.

Referring to FIG. 18, the QDs protected with the combination of the house and jacket shielding method were mixed with UV cured acrylate adhesive and were further injected in to the dome of the lens. The QD lenses were then subjected to two conditions including 65° C. 95% RH and 85° C. for reliability test. The QD layers directly came in contact with environment without any outer layer, and therefore were tested in a harsher condition in RA test. The results were based on the change of white point coordinate and were observed as follows. Table 6 refers to 65° C. 95% RH test and Table 7 refers to the 85° C. test.

TABLE 6

| | X | | | Y | | |
|---|---|---|---|---|---|---|
| Trial | 500 h | 0 h | Δ | 500 h | 0 h | Δ |
| 6595_001 | 0.206 | 0.2052 | 0.0008 | 0.1893 | 0.1848 | 0.0045 |
| 6595_002 | 0.1953 | 0.196 | −0.0007 | 0.1655 | 0.16 | 0.0055 |

As depicted in Table 6, it was observed that after 500 h acceleration test, both X & Y coordinate shifted within ±0.01 which is a standard of RA test for TV WP standard.

TABLE 7

| | X | | | Y | | |
|---|---|---|---|---|---|---|
| Trial | 250 h | 0 h | Δ | 250 h | 0 h | Δ |
| 85_001 | 0.2221 | 0.2169 | 0.0052 | 0.2146 | 0.2163 | −0.0017 |
| 85_002 | 0.2039 | 0.2036 | −0.0003 | 0.1801 | 0.1882 | −0.0081 |

As depicted in Table 7, it was observed that after 250 h high temperature acceleration test, both X & Y coordinate shifted within ±0.01 which is a standard of RA test for TV reliability standard.

From the above results, it must be realized and appreciated that the barrier free quantum dot particles (BFQDs) formulation disclosed in the present application shows good stability towards both high temperature and high humidity test even without a supporting film. Such results may provide a convincing evidence to develop the QD adhesive for LED application. Furthermore, the QD on lens were tested under strong blue light radiation around 10 W/cm² to confirm the stability of QD under strong blue light radiation. The RA results are shown in Table 8.

TABLE 8

| | Luminous flux (lm) | Chromaticity Coordinate | |
|---|---|---|---|
| | | X | Y |
| 0 h | 47.13 | 0.2874 | 0.3081 |
| 620 h | 46.3 | 0.2869 | 0.3084 |
| 1490 h | 47.2 | 0.2868 | 0.3083 |
| 1800 h | 47.5 | 0.287 | 0.3085 |
| 2350 h | 44.24 | 0.2865 | 0.3087 |
| Δ | 2.89 | 0.0009 | −0.0006 |

The results depicted in Table 8 indicates that the QDs have good stability under strong blue light radiation and the chromaticity coordinate does not change much after 2350 h radiation and thereby achieving the reliability standard for TV application. Example 8

Figure 19:
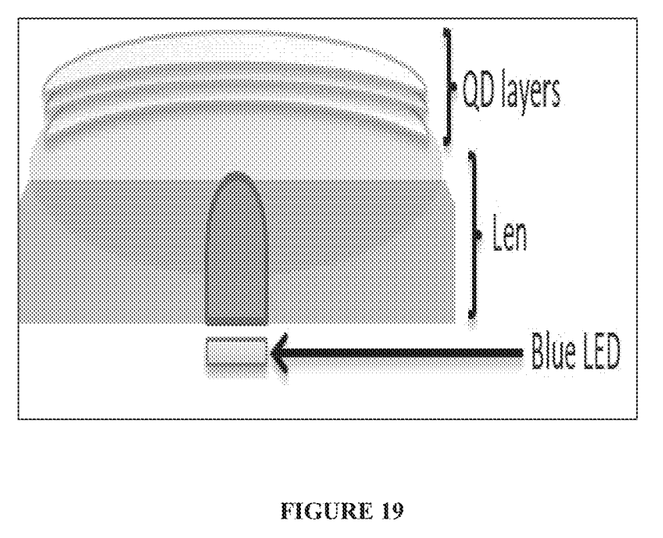
FIG. 19 illustrates a blue LED and fabrication method of a LED lens comprising a layer of barrier free quantum dot coating, in accordance with an embodiment of the present application.

Referring to FIG. 19, the QD film fabricated and implemented on the lens is shown, in accordance with an embodiment of the present application. A method of fabricating BFQDF over LED light source is implemented to accompany the task. A spray valve is used to spray a layer of QDs on the surface of the lens and therefore the blue light from the LED may enter the lens without changing the light path. The QDs on the surface of lens are then excited by blue light and finally mixed as white light for display application.

The QDs protected by one or more shielding methods described in the disclosure above are mixed with UV cured acrylate adhesive with suitable viscosity. The shielded QD dispersed adhesive is then sprayed on the surface of lens. The thickness of the lens is around 10 µm in thickness and followed by UV curing. Depending on the application, various number of QD layers can be deposited on the surface of lens.

Example 9

Ligand based shielding method and jacket shielding method-based quantum dot particles are demonstrated and used to improve the colour gamut of LCD display owning to the high quantum efficiencies of two fundamental colours from quantum materials, the red emissive and the green emissive quantum dot particles. With the advantages of narrow emission spectra (full width half maximum <35 nm) and well controlled peak wavelengths (510-530 nm & 610-640 nm), a display with high colour purity may fulfil a new colour space standard, the Rec. 2020 colour space. In order to achieve a high color gamut, specific peak emission and narrow FWHM should be well defined. For green QDs, the emission is confined at (520-530) nm to obtain the highest brightness. For red QDs, the emission peak is confined at (635-645) nm to obtain a more red color in order to maximize the area of color gamut.

The embodiments, examples and alternatives of the preceding paragraphs or the description and drawings, including any of their various aspects or respective individual features, may be taken independently or in any combination. Features described in connection with one embodiment are applicable to all embodiments, unless such features are incompatible.

What is claimed is:
1. A method of fabricating a barrier free quantum dot particles layer film, comprising:
  shielding quantum dot particles by at least one of a shielding method to form shielded quantum dot particles; and
  dispersing the shielded quantum dot particles in an adhesive comprising an acrylate adhesive, a silicone adhesive, a thermoplastic adhesive, or an UV cured adhesive to form a free standing quantum dot particles layer;
  wherein the shielded quantum dot particles are resistant to at least one of condition selected from the group consisting of high temperature, high humidity and water;
  wherein the quantum dot particles are shielded by at least one of a house shielding method, a ligand shielding method and a jacket shielding method; and
  wherein the house shielding method comprises encapsulating the quantum dot particles by swelling and shrinking of carrier polymers in a solvent; wherein the swelling is carried out by heating the carrier polymers; wherein the shrinking is carried out by cooling of the carrier polymers; wherein the encapsulating of quantum dot particles is controlled by sonicating and further evaporating excess solvent from the carrier polymers; wherein encapsulation efficiency of the carrier polymers is within a range of 5 to 20%; and wherein the house shielding method is characterized in providing moisture resistance property to the shielded quantum dot particles.

2. The method according to claim 1, wherein the film comprises a step of sandwiching a free standing quantum dot particles layer of quantum dot particles between at least two outer layers; wherein each of the at least two outer layers is a film selected from the group consisting of polyethylene terephthalate (PET) film, a polyethylene naphthalate (PEN) film and a polyacrylonitrile (PAN) film.

3. The method according to claim 2, wherein a water vapor transmission rate (WVTR) and an oxygen transmission rate (OTR) for each of the at least two outer layers is within a range of 1-10 g/m²d and 50-200 cm³/m²d, respectively.

4. The method according to claim 1, wherein the quantum dot particles are made of a material selected from the group consisting of CdSe, ZnS, CdZnS, MAPbX3 (MA=methylammonium; X=Cl, Br, I), and combinations thereof; wherein size of quantum dot particles is within a range of 4 nm to 8 nm; and wherein the quantum dot particles are hydrophobized with hydrophobic ligand comprising one or more of C3-C21 aliphatic, branched, cyclic and aromatic thiol.

5. The method according to claim 1, wherein the house shielding method comprises adding crosslinked polymer beads as quantum dot carriers; wherein the crosslinked polymer beads comprises at least one of polystyrene and polymethyl methacrylate; wherein the crosslinking of polymer beads are crosslinked by a crosslinker selected from the group consisting of divinylbenzene, N,N'-Methylene-bis-acrylamide, and ethylene glycol di-methacrylate crosslinker; and wherein a size of the crosslinker is within a range of 100 nm to 5 μm; and wherein the amount of the crosslinker in a dispersion is within a range of 1 to 5% wt.

6. The method according to claim 1, wherein the ligand shielding method comprises encapsulating the quantum dot particles with a surfactant ligand co-system in a form of liquid, grease or paste; wherein the surfactant ligand co-system comprises a surfactant and a ligand; and wherein the ligand shielding method provides surface rigidity and extra stability to the quantum dot particles.

7. The method according to claim 6, wherein the surfactant is selected from one of the following:
a block copolymer selected from the group consisting of poly(ethylene glycol)-block-poly(propylene glycol)-block-poly(ethylene glycol), poly(propylene glycol)-block-poly(ethylene glycol)-block-poly(propylene glycol), and polystyrene-block-poly(acrylic acid);
a copolymer selected from the group consisting of poly (methyl methacrylate-co-methacrylic acid), and poly (styrene)-co-methacrylic acid; and
a non-ionic surfactant selected from the group consisting of polyethylene glycol oleyl ether, polyoxyethylene (5) nonylphenylether, and polyethylene-block-poly(ethylene glycol);
wherein the surfactant is present in an amount within a range of 1-10% wt;
wherein the ligand is selected from the group consisting of Pluronic P123, octanethiol, C3-C21 aliphatic thiols, branched thiols, cyclic thiols, aromatic thiol, C3-C21 aliphatic amines, branched amines, cyclic amines and aromatic amines; and
wherein the ligand is present in an amount within a range of 1-10% wt.

8. The method according to claim 1, wherein the jacket shielding method comprises core/shell shielding the quantum dot particles with a multi-shell coating on metal-alloyed cores of the quantum dot particles; wherein the multi shell coating comprises a coating layer of 1-5 shells; wherein a total size of the shielded quantum dot particles ranges from 8 nm to 20 nm, a size of the metal-alloyed core ranges from 4 nm to 8 nm, and a thickness of the multi-shell coating ranges from 2 nm to 6 nm; and wherein the jacket shielding method provides thermal resistant properties to the shielded quantum dot particles; and wherein the metal-alloyed core is made of at least one metal alloy selected from the group consisting of CdSe, ZnSe, CdZnSeS, CdTe and MAPbX3 (MA=methylammonium; X=Cl, Br, I), and the multi-shell coating is made of at least one of ZnS and CdZnS.

9. The method according to claim 1, wherein the shielded quantum dot particles free standing film is fabricated on a light emitting diode (LED) lens by a method comprising:
a first step of spraying a free standing layer of shielded quantum dot particles on a surface of LED lens;
a second step of enabling a blue light to enter the LED lens without changing the light path;
a third step of exciting the shielded quantum dot particles by blue light;
a fourth step of mixing the shielded quantum dot particles as white light for display, and
a fifth step of mixing the shielded quantum dot particles with UV or thermal curable adhesive and then spraying on the surface of the LED lens.

* * * * *